(12) United States Patent
Pannman

(10) Patent No.: US 9,100,040 B2
(45) Date of Patent: Aug. 4, 2015

(54) DATA CONVERSION BASED ON A PROVIDED DICTIONARY

(75) Inventor: Evgeny Pannman, Petah-Tikva (IL)

(73) Assignee: SAP SE, Walldorf (DE)

( * ) Notice: Subject to any disclaimer, the term of this patent is extended or adjusted under 35 U.S.C. 154(b) by 366 days.

(21) Appl. No.: 13/597,275

(22) Filed: Aug. 29, 2012

(65) Prior Publication Data

US 2014/0067993 A1 Mar. 6, 2014

(51) Int. Cl.
*G06F 15/16* (2006.01)
*H03M 7/30* (2006.01)

(52) U.S. Cl.
CPC .......... *H03M 7/3088* (2013.01); *H03M 7/6076* (2013.01)

(58) Field of Classification Search
USPC ............................ 709/217, 219, 246, 247, 250
See application file for complete search history.

(56) References Cited

U.S. PATENT DOCUMENTS

| | | | | |
|---|---|---|---|---|
| 6,112,250 | A * | 8/2000 | Appelman | 709/247 |
| 6,963,972 | B1 * | 11/2005 | Chang et al. | 713/153 |
| 7,259,701 | B2 * | 8/2007 | Parida et al. | 341/87 |
| 8,295,615 | B2 * | 10/2012 | Celi, Jr. | 382/232 |
| 8,400,334 | B2 * | 3/2013 | Lee et al. | 341/51 |
| 2003/0028673 | A1 * | 2/2003 | Lin et al. | 709/247 |

* cited by examiner

*Primary Examiner* — Viet Vu

(57) ABSTRACT

A computerized method for data conversion, comprising receiving a data sequence, receiving a dictionary having patterns respective to patterns in the data sequence, and converting the data sequence by substituting the patterns in the data sequence with at least one of the patterns of the dictionary respective to the patterns in the data sequence, or references to the patterns of the dictionary respective to the patterns in the data sequence, or a combination thereof, and an apparatus for performing the same.

15 Claims, 3 Drawing Sheets

DATA CONVERSION BASED ON A PROVIDED DICTIONARY

BACKGROUND

The present disclosure generally relates to data compression and encoding, and more specifically to data compression and encoding based on pre-defined dictionaries.

Generally, at least in some cases, data compression is founded on identifying repeated or redundant patterns in the data, where the data is compressed using references to the patterns rather than the patterns per se.

Also, generally at least in some cases, encoding is used by substituting patterns with different patterns.

SUMMARY

One exemplary embodiment of the disclosed subject matter is a computerized method for data conversion, comprising receiving a data sequence, receiving a dictionary having patterns respective to patterns in the data sequence, and converting the data sequence by substituting the patterns in the data sequence with at least one of the patterns of the dictionary respective to the patterns in the data sequence, or references to the patterns of the dictionary respective to the patterns in the data sequence, or a combination thereof, and wherein the method is performed on an at least one computerized apparatus configured to perform the method.

Another exemplary embodiment of the disclosed subject matter is a computerized system for data conversion, comprising, a first computerized apparatus configured for generating a dictionary having patterns respective to patterns in a data sequence, and a second computerized apparatus configured for receiving from the first computerized apparatus the data sequence and the dictionary and further configured for converting the data sequence by substituting the patterns in the data sequence with at least one of the patterns of the dictionary respective to the patterns in the data sequence, or references to the patterns of the dictionary respective to the patterns in the data sequence, or a combination thereof.

In the context of some embodiments of the present disclosure, without limiting, a 'message' denotes a sequence or any arrangement of data handled as a unit that is transferred and/or transferable between entities, such as between apparatuses. For brevity without limiting, a reference to a message implies also the data of a message.

In the context of the present disclosure, without limiting, terms referring to compression, such as 'compression', 'decompression' or 'un-compressed', are as used or understood in the art of computer science and software engineering.

In the context of the present disclosure, without limiting, terms referring to encoding, such as 'encoded', 'decoding' or 'decoded', are as used or understood in the art of computer science and software engineering.

In the context of the present disclosure, without limiting, terms referring to conversion of data imply a transformation of data by compression and/or encoding. For example, a 'converted' message implies a message that was compressed and/or encoded, and a 'deconverted' message implies a decompressed and/or decoded message, wherein the term 'deconvert' or 'de-convert' and related terms imply the reverse or undoing of conversion.

Thus, the term conversion and related ones are used, without limiting, to encompass each or both of compression and/or encoding and respective related terms thereof.

In the context of some embodiments of the present disclosure, without limiting, the term 'original' with respect to a message and/or data thereof and/or other data denotes an unconverted content of the respective message and/or data thereof and/or other data.

In the context of some embodiments of the present disclosure, without limiting, a 'dictionary' denotes an arrangement of patterns that are substituted and/or referred to in respective patterns of a data sequence, thereby converting the data sequence, and likewise used to restore a converted data sequence to the original form thereof. Generally, the positions of the patterns in a converted data sequence can be obtained according to the specification of the conversion such as specification of compression or specification of encoding.

As used herein, without limiting, the term 'sequence' as applied to data denotes any arrangement of the data or items thereof and not necessarily in a successive order, unless specified otherwise.

The terms cited above denote also inflections and conjugates thereof.

BRIEF DESCRIPTION OF THE DRAWINGS

Some non-limiting exemplary embodiments or features of the disclosed subject matter are illustrated in the following drawings.

Identical or duplicate or equivalent or similar structures, elements, or parts that appear in one or more drawings are generally labeled with the same reference numeral, and may not be repeatedly labeled and/or described.

Figure 1:
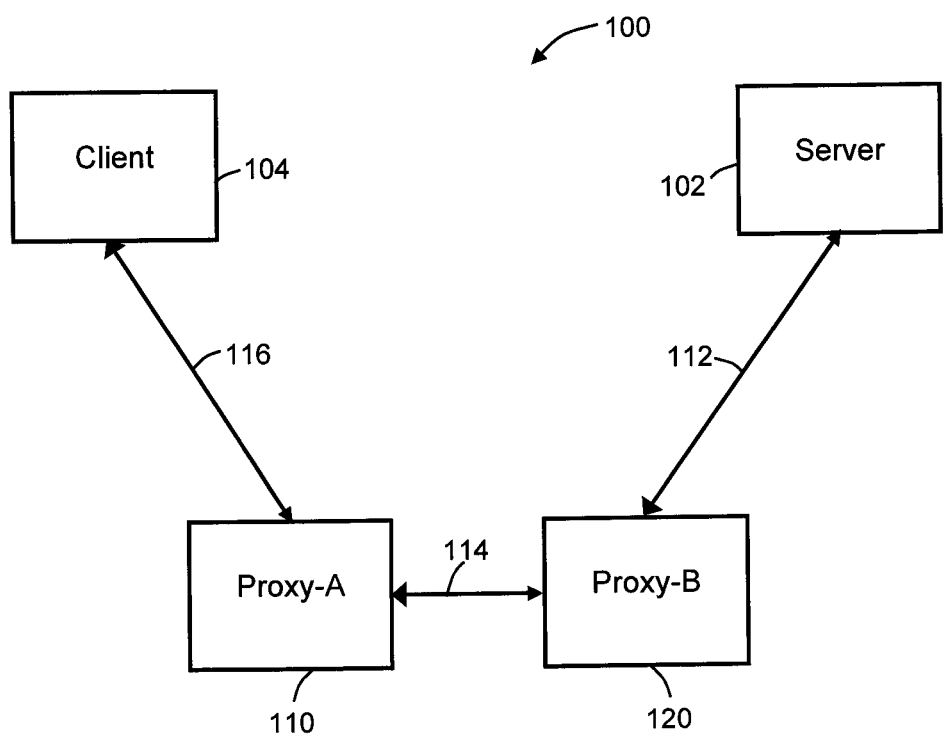

Dimensions of components and features shown in the figures are chosen for convenience or clarity of presentation and are not necessarily shown to scale or true perspective. For convenience or clarity, some elements or structures are not shown or shown only partially and/or with different perspective or from different point of views.

References to previously presented elements are implied without necessarily further citing the drawing or description in which they appear.

Figure 2A:
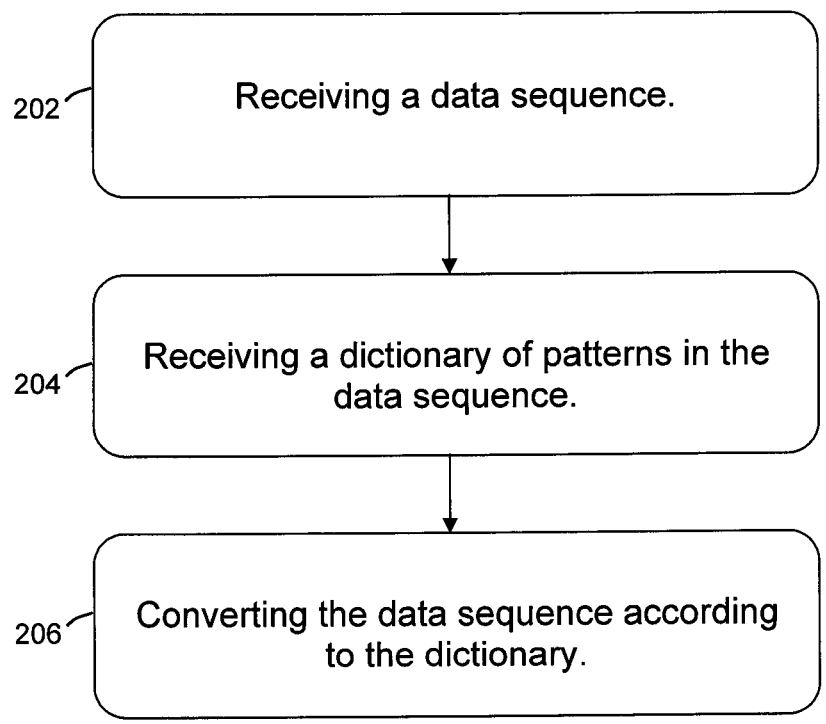
Figure 2B:
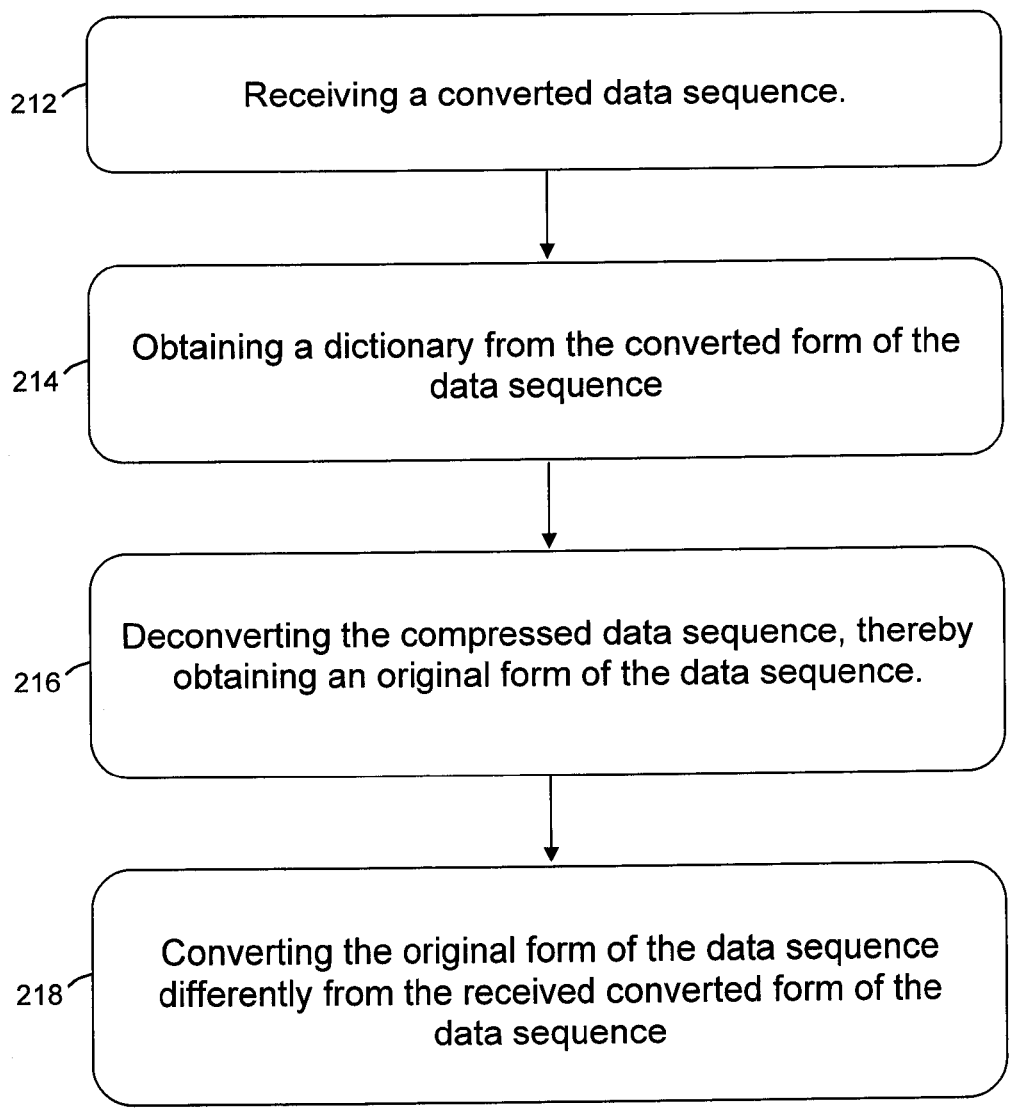

FIG. 1 schematically illustrates a system for receiving at a client a message from a server, according to exemplary embodiments of the disclosed subject matter;

FIG. 2A outlines operations in using a dictionary for converting a data sequence according to exemplary embodiments of the disclosed subject matter; and FIG. 2B outlines operations in using a dictionary for deconverting a data sequence according to exemplary embodiments of the disclosed subject matter.

DETAILED DESCRIPTION

One technical problem dealt by the disclosed subject matter is enhancing the efficiency of data conversion such as compression and/or encoding.

One technical solution according to the disclosed subject matter is a first computerized apparatus linked to a second computerized apparatus, wherein the first computerized apparatus receives from the second computerized apparatus a message along with a dictionary of the message. The dictionary is directly used by the first computerized apparatus to convert the data of the message without having to analyze the message for identifying the dictionary patterns. For example, the dictionary is used to compress the message by directly using the dictionary for repeated patterns, or for example, the dictionary is used to replace patterns by substitute patterns in the dictionary and/or mapping patterns in the dictionary to patterns in the message, thus the dictionary may be referred to as the encoding keys or keys.

In some embodiments, the first computerized apparatus receives the data of the message in a converted form. In such a case the data is deconverted and the dictionary is used, or re-used, directly in converting the message by another algorithm that is, at least potentially, yields better compression in terms of size and/or encoding in better protection and/or size, without having to analyze the deconverted message for identifying the dictionary patterns and/or keys.

A potential technical effect of the disclosed subject matter is a faster conversion of a message relative to converting the message anew 'from scratch' for identifying patterns in the message.

A general non-limiting overview of practicing the present disclosure is presented below. The overview outlines exemplary practice of embodiments of the present disclosure, providing a constructive basis for variant and/or alternative and/or divergent embodiments, some of which are subsequently described.

A distinctive non-limiting aspect of the disclosed subject matter is conversion of data based on a provided dictionary. The provided dictionary is pre-defined and/or extracted from a converted data so that the extracted dictionary may be re-used for converting the data.

Generally, conversion such as compression of a data sequence is a time consuming process, in which extraction of repeated patterns to form a dictionary takes a considerable toll which becomes more significant as the volume of the data increases.

Thus, having in advance a dictionary of a data sequence can speed-up a conversion operation relative to having to analyze the data and extract patterns therein, the difference in speed generally being more prominent as the size of the data increases.

Some non-limiting examples of circumstances where a provided dictionary of a data sequence is used to convert the data sequence are described below.

In some embodiments, a dictionary is provided along with a message, such as by a server computer, to be transferred to a client computer. In some embodiments, the server computer and the client computer are linked therebetween by one or more intermediary apparatuses. One of the intermediary apparatus receives the message and the dictionary, and converts the provided message utilizing the provided dictionary, and forwards the converted message to the client, optionally via another intermediary apparatus.

In some embodiments, the message is provided by the server computer to the one intermediary apparatus in a converted form, and the intermediary apparatus deconverts the converted message and extracts the dictionary. Further, the one intermediary apparatus utilizes, or re-uses, the dictionary to convert the message by different conversion algorithm. Optionally, the different conversion algorithm, at least potentially, yields a better compression ratio than the provided compressed message and/or yields safer encoding then the provided encoded message. Consequently, in some embodiments, the one intermediary apparatus forwards the converted message to the client, optionally via another intermediary apparatus.

In some embodiments, one apparatus is linked to the another apparatus by a less expensive and/or a faster link than the link between the intermediary apparatuses and the server computer and/or client computer, such that the link between the intermediary apparatuses is used more efficiently relative to a conversion of the message as provided by the server computer.

In some embodiments, the message as provided by the server computer to the one intermediary apparatus is compressed by an algorithm of the art such as ZIP or RAR (win.rar GmbH). It is noted that the specification of the compressed structure of ZIP and RAR are known in the art and may be used for accessing contents of the compressed structure. For example, http://www.pkware.com/documents/casestudies/APPNOTE.TXT, or http://kthoom.googlecode.com/hg/docs/unrar.html, respectively. Optionally or alternatively, tools and/or utilities and/or libraries and/or components of the art may be used to access the contents of the compressed structure.

For brevity, compression by an algorithm of the art is generally, without limiting, referred to as ZIP.

Also for brevity and clarity, unless otherwise or particularly specified, referring below to compression or related terms represents, mutatis mutandis, also or alternatively conversion by encoding, such that decompression implies also or alternatively decoding, and so forth.

FIG. 1 schematically illustrates a system 100 for receiving at a client 104 a message from a server 102, according to exemplary embodiments of the disclosed subject matter.

Each of Server 102 and client 104 constitutes and/or comprises a computerized apparatus configured for linking and/or communication with other apparatuses, where the terms 'client' and 'server' denote exemplary non-limiting roles of server 102 and client 104, respectively, in system 100.

Client 104 communicates with server 102 via a first proxy, denoted also as proxy 110, that communicates with a second proxy, denoted also as proxy 120, where the second proxy communicates with server 102. Similarly, server 102 communicates with client 104 via the second proxy that communicates with the first proxy that further communicates with client 104. The communication between server 102 and the second proxy is indicated by a double-arrow 112, the communication between the second proxy and the first proxy is indicated by a double-arrow 114, and the communication between the first proxy and client 104 is indicated by a double-arrow 116. The communications as indicated by double-arrow 112 and/or double-arrow 114 and/or double-arrow 116 comprise or may comprise multiple communications stages and/or hops involving intermediary apparatuses such as routers and/or bridges and/or relays.

Each of proxy 110 and proxy 120 constitutes and/or comprises a computerized apparatus configured for linking and/or communication with other apparatuses.

Generally and without limiting, client 104 sends short request messages to server 102, and server 102 responds by large messages as compared with the request messages of client 104, as illustrated schematically by the relative arrow heads of double-arrow 112, double-arrow 114 and double-arrow 116.

For brevity and without limiting, by way of example, server 102 hosts data such as a web-page, referred to also, for brevity, as a page. Thus, in some embodiments and by way of example, client 104 requests the page from server 102 via proxy 110 and proxy 120 and server 102 provides the page to client 104 via proxy 120 and proxy 110.

In some embodiments, the communication between the first proxy and the second proxy is slower and/or costlier than the communication between client 104 and the first proxy and/or than the communication between the second proxy and server 102. For example, the communication between the second proxy and server 102 and the communication between client 104 and the first proxy are local ones, such as LAN (local area network), whereas the communication between the first proxy and the second proxy is a remote one such as by overseas cable or via a satellite or through a bridge connecting LAN and WAN (wide area network).

Thus, it would be beneficial to transmit between the first proxy and the second proxy a compressed message that is compressed by an algorithm at least potentially better in terms of compression ratio than ZIP, or, for that matter, a message encoded by better coding such as with better encryption or resultant size, wherein for generality and brevity the algorithm is referred to as an 'enhanced algorithm'.

An example of the enhanced algorithm is the Accad (Accelerated Application Delivery, SAP AG) process that is generally, at least potentially, better in terms of compression ratio than ZIP and/or the encoding thereof is better protected and/or smaller in size relative to at least some other encoding schemes.

As an example of utilizing a provided dictionary, when the page is sent by server 102 for client 104 and received by proxy 120, a dictionary of the page is sent and received as well along with the page. Proxy 120 uses the provided dictionary and compresses the page with the enhanced algorithm, and sends the compressed page to proxy 110. In some embodiments, proxy 110 forwards the compressed message to client 104. Optionally or alternatively, such as for compatibility with client 104 that may not have resources for decompressing a message compressed by the enhanced algorithm, proxy 110 decompresses the message and re-compresses the decompressed massage by ZIP and forwards the compressed message to client 104.

In some embodiments, as long as the page is not modified, server 120 prepares the dictionary of the page once and uses the dictionary for a plurality of requests from one and/or a plurality of client 104. Optionally, server 102 prepares the dictionary in a background process such as by utilizing idle times of server 102.

In some embodiments, server 102 sends the page in uncompressed form, along with the dictionary to proxy 120. In some embodiments, server 102 sends the page to proxy 120 in a lossless transformed form, along with the dictionary, wherein, optionally, the transformed form is a compressed form or any other form such as an encrypted form and/or an encoded form. Consequently, in some embodiments, proxy 120 uses the dictionary and compresses the page, either by ZIP or the enhanced algorithm, and sends the compressed page to proxy 110 for delivery to client 104. Optionally or alternatively, proxy 120 sends the page in uncompressed and/or transformed form to proxy 110 where proxy 110 compresses the page by using the dictionary and delivers the compressed page to client 104.

In some embodiments, server 102 sends the page in a ZIP compression form along with the dictionary. Alternatively, in some embodiments, the dictionary is embedded and/or appended to the compressed page. Consequently, proxy 120 receives the compressed page and obtains the dictionary and/or extracts the dictionary from the compressed page, and uses, that is, re-uses, the dictionary to de-compress the page and to compress the page by the enhanced algorithm and, consequently sends it to proxy 110 for forwarding the page to client 104 as described above.

The scenarios above are non-limiting exemplary embodiments of using pre-defined or pre-determined dictionary for compressing data, where other embodiments may be used. For example, sending to a party in one transmission a compressed data without the dictionary and the dictionary in another transmission, providing a secure transmission of the data that in case an individual transmission is intercepted would be useless, whereas the intended party can use the dictionary and combine the compressed data and the dictionary to a regular compressed form.

FIG. 2A outlines operations in using a dictionary for converting a data sequence according to exemplary embodiments of the disclosed subject matter.

In operation 202 a data sequence is received, for example, at proxy 120 as sent from server 102.

In operation 204 a dictionary of patterns, for example, redundant patterns, in the data sequence is received, such as along with the data sequence.

In operation 206 the data sequence according to the dictionary is converted by substituting the patterns with references to or by the respective entries in the dictionary.

For example, in compression the dictionary is included in the compressed data and entries thereof are referenced for the respective patters, and in encoding the entries of the dictionary are mapped or substitute the respective patterns and the dictionary is comprised in the encoded data, optionally in disguised form.

In some embodiments, patterns in the dictionary are shorter, at least in average, than the respective patterns in the data so that the encoded data is shorter than the original data, optionally also when the encoded data comprises the dictionary.

FIG. 2B outlines operations in using a dictionary for re-compressing a data sequence according to exemplary embodiments of the disclosed subject matter.

In operation 212 a converted data sequence is received, for example, at proxy 120 as sent from server 102.

In operation 214 a dictionary of patterns in the original data sequence is obtained from the converted form of the data sequence.

In operation 216 the converted data sequence is de-converted, and an original unconverted data sequence is obtained.

In operation 218 the obtained original form of the data sequence is converted differently from the received compressed form of the data sequence. For example, the obtained original data sequence is compressed by a different algorithm and/or the encoded by a different encoding scheme.

In some embodiments, the different compression algorithm yields a better compression relative to the received compressed form of the data sequence, and in some embodiments the different encoding scheme provides safer form in terms of protection to potential intruders relative to the received encoded form of the data sequence.

In some embodiments, the order of operations may be modified. For example, operation 204 may precede operation 202. In some embodiments, some operations may be combined, for example, operation 202 and operation 204 may be combined.

In some embodiments, the operations described above are performed on a computerized apparatus, such as proxy 120, configured by hardware and/or software and/or firmware to perform the methods in an appropriate order and manner.

In the demonstration below compression is referred to as an example of conversion.

Specifications for compressing data in ZIP format (Gzip) is provided by Aladdin Enterprises (http://www.ietf.org/rfc/), for example, in rfc1951.pdf and rfc1952.pdf.

Using the specifications one may extract the dictionary of a compressed file or data.

For example, using 'ABABBCABBACBBCABCBAAB-BCCAA' as an original data sequence, by the specifications the dictionary can be acquired as listed in Table-1 below.

TABLE 1

| | | |
|---|---|---|
| 0 | 1 | BFINAL - last block |
| 1 | 0 | BTYPE - 10 - compressed with dynamic |
| 2 | 1 | Huffman code |
| 3 | 0 | HLIT - size of literal alphabet |
| 4 | 0 | 257 + HLIT |
| 5 | 0 | 0 + 257 = 257 symbols |
| 6 | 0 | |
| 7 | 0 | |
| 8 | 1 | HDIST - size of distance alphabet |
| 9 | 0 | 1 + HDIST |
| 10 | 0 | 1 + 1 = 2 |
| 11 | 0 | |
| 12 | 0 | |
| 13 | 0 | HCLEN - number of Code Length codes |
| 14 | 1 | (HCLEN + 4) * 3 |
| 15 | 1 | (14 + 4) * 3 = 54 bits |
| 16 | 1 | |
| 17 | 0 | Code 16 value 0 |
| 18 | 0 | |
| 19 | 0 | |
| 20 | 1 | Code 17 value 3 |
| 21 | 1 | |
| 22 | 0 | |
| 23 | 0 | Code 18 value 2 |
| 24 | 1 | |
| 25 | 0 | |
| 26 | 0 | Code 0 value 0 |
| 27 | 0 | |
| 28 | 0 | |
| 29 | 0 | Code 8 value 0 |
| 30 | 0 | |
| 31 | 0 | |
| 32 | 0 | Code 7 value 0 |
| 33 | 0 | |
| 34 | 0 | |
| 35 | 0 | Code 9 value 0 |
| 36 | 0 | |
| 37 | 0 | |
| 38 | 0 | Code 6 value 0 |
| 39 | 0 | |
| 40 | 0 | |
| 41 | 0 | Code 10 value 0 |
| 42 | 0 | |
| 43 | 0 | |
| 44 | 0 | Code 5 value 0 |
| 45 | 0 | |
| 46 | 0 | |
| 47 | 0 | Code 11 value 0 |
| 48 | 0 | |
| 49 | 0 | |
| 50 | 1 | Code 4 value 3 |
| 51 | 1 | |
| 52 | 0 | |
| 53 | 0 | Code 12 value 0 |
| 54 | 0 | |
| 55 | 0 | |
| 56 | 1 | Code 3 value 3 |
| 57 | 1 | |
| 58 | 0 | |
| 59 | 0 | Code 13 value 0 |
| 60 | 0 | |
| 61 | 0 | |
| 62 | 1 | Code 2 value 3 |
| 63 | 1 | |
| 64 | 0 | |
| 65 | 0 | Code 14 value 0 |
| 66 | 0 | |
| 67 | 0 | |
| 68 | 0 | Code 1 value 2 |
| 69 | 1 | |
| 70 | 0 | |
| 71 | 1 | (111) => code 17 with value 7 => |
| 72 | 1 | 10 times repeat 0 |
| 73 | 1 | |
| 74 | 1 | |
| 75 | 1 | |
| 76 | 1 | |
| 77 | 1 | (110) => Code 4 => length 4 |
| 78 | 1 | 0x10 - end of line |
| 79 | 0 | |
| 80 | 0 | (01) => code 18 with value 0x2b => |
| 81 | 1 | repeat code length of 0 for 11 + 0x2b = 54 times |
| 82 | 1 | |
| 83 | 1 | |
| 84 | 0 | |
| 85 | 1 | |
| 86 | 0 | |
| 87 | 1 | |
| 88 | 0 | |
| 89 | 1 | (100) => code 2 => length 2 "A" |
| 90 | 0 | |
| 91 | 0 | |
| 92 | 0 | (00) => code 1 => length 1 "B" |
| 93 | 0 | |
| 94 | 1 | (101) => code 3 => length 3 "C" |
| 95 | 0 | |
| 96 | 1 | |
| 97 | 0 | (01) => code 18 with value 7f |
| 98 | 1 | repeat code length of 0 for 11 + 0x7f = 138 times |
| 99 | 1 | |
| 100 | 1 | |
| 101 | 1 | |
| 102 | 1 | |
| 103 | 1 | |
| 104 | 1 | |
| 105 | 1 | |
| 106 | 0 | (01) => code 18 with value 0x27 |
| 107 | 1 | repeat code length of 0 for 11 + 0x27 = 50 times |
| 108 | 1 | |
| 109 | 1 | |
| 110 | 1 | |
| 111 | 0 | |
| 112 | 0 | |
| 113 | 1 | |
| 114 | 0 | |
| 115 | 1 | (110) =>Code 4 => length 4 |
| 116 | 1 | "256" |
| 117 | 0 | |
| 118 | 0 | 00:00 - no distance code is used |
| 119 | 0 | |
| 120 | 0 | |
| 121 | 0 | |

The first column is an ordinal number; the second column is a bit value of the respective entry of the ordinal number in the list, and the third column is a brief explanation of the bit value.

Thus there is provided according to the disclosed subject matter a computerized method for data conversion, comprising receiving a data sequence, receiving a dictionary having patterns respective to patterns in the data sequence, and converting the data sequence by substituting the patterns in the data sequence with at least one of (i) the patterns of the dictionary respective to the patterns in the data sequence, or (ii) references to the patterns of the dictionary respective to the patterns in the data sequence, or (iii) a combination thereof, wherein the method is performed on an at least one computerized apparatus configured to perform the method.

In some embodiments, the data sequence is received in a converted form based on the dictionary.

In some embodiments, the data sequence is received in a converted form that comprises the dictionary, and further comprises de-converting the converted form of the data sequence, thereby obtaining an original form of the data sequence, obtaining the dictionary from the converted form of the data sequence, and converting the original form of the data sequence based on the dictionary, wherein said converting comprises generating a converted form of the original form of the data sequence that is different from the received converted form of the data sequence.

In some embodiments, converting the data sequence comprises compressing the data sequence.

In some embodiments, de-converting the converted form of the data sequence comprises decompressing the converted form of the data sequence.

In some embodiments, converting the data sequence comprises encoding of the data sequence.

In some embodiments, de-converting the converted form of the data sequence comprises decoding the converted form of the data sequence.

In some embodiments, generating the converted form of the data sequence that is different from the received converted form of the data sequence comprises generating the converted form of the data sequence by the Accad process.

There is further provided according to the disclosed subject matter a computerized system for data conversion, comprising, a first computerized apparatus configured for generating a dictionary having patterns respective to patterns in a data sequence, and a second computerized apparatus configured for receiving from the first computerized apparatus the data sequence and the dictionary and further configured for converting the data sequence by substituting the patterns in the data sequence with at least one of (i) the patterns of the dictionary respective to the patterns in the data sequence, or (ii) references to the patterns of the dictionary respective to the patterns in the data sequence, or (iii) a combination thereof.

In some embodiments, the first computerized apparatus is configured for providing the data sequence and the dictionary in a converted form to the second computerized apparatus, and wherein the second computerized apparatus is configured for:

de-converting the converted form of the data sequence, thereby obtaining an original form of the data sequence;

obtaining the dictionary from the converted form of the data sequence; and converting the original form of the data sequence to generate a converted form of the data sequence that is different from the converted form of the data sequence provided by the first computerized apparatus.

In some embodiments, the second computerized apparatus is configured for forwarding a compressed data sequence to a third computerized apparatus.

In some embodiments, converting the data sequence comprises compressing the data sequence.

In some embodiments, de-converting the converted form of the data sequence comprises decompressing the converted form of the data sequence.

In some embodiments, converting the data sequence comprises encoding of the data sequence.

In some embodiments, de-converting the converted form of the data sequence comprises decoding the converted form of the data sequence.

In some embodiments, the converted form of the data sequence that is different from the converted form of the data sequence provided by the first computerized apparatus is generated by the Accad process.

In the context of some embodiments of the present disclosure, by way of example and without limiting, terms such as 'operating' or 'executing' imply also capabilities, such as 'operable' or 'executable', respectively.

The terms 'processor' or 'computer', or system thereof, are used herein as ordinary context of the art, such as a general purpose processor or a micro-processor, RISC processor, or DSP, possibly comprising additional elements such as memory or communication ports. Optionally or additionally, the terms 'processor' or 'computer' or derivatives thereof denote an apparatus that is capable of carrying out a provided or an incorporated program and/or is capable of controlling and/or accessing data storage apparatus and/or other apparatus such as input and output ports. The terms 'processor' or 'computer' denote also a plurality of processors or computers connected, and/or linked and/or otherwise communicating, possibly sharing one or more other resources such as a memory.

The terms 'software', 'program', 'software procedure' or 'procedure' or 'software code' or 'code' or 'application' may be used interchangeably according to the context thereof, and denote one or more instructions or directives or circuitry for performing a sequence of operations that generally represent an algorithm and/or other process or method. The program is stored in or on a medium such as RAM, ROM, or disk, or embedded in a circuitry accessible and executable by an apparatus such as a processor or other circuitry.

The processor and program may constitute the same apparatus, at least partially, such as an array of electronic gates, such as FPGA or ASIC, designed to perform a programmed sequence of operations, optionally comprising or linked with a processor or other circuitry.

The term computerized apparatus or a computerized system or a similar term denotes an apparatus comprising one or more processors operable or operating according to one or more programs.

As used herein, without limiting, a module represents a part of a system, such as a part of a program operating or interacting with one or more other parts on the same unit or on a different unit, or an electronic component or assembly for interacting with one or more other components.

As used herein, without limiting, a process represents a collection of operations for achieving a certain objective or an outcome.

The term 'configuring' and/or 'adapting' for an objective, or a variation thereof, implies using at least a software and/or electronic circuit and/or auxiliary apparatus designed and/or implemented and/or operable or operative to achieve the objective.

A device storing and/or comprising a program and/or data constitutes an article of manufacture. Unless otherwise specified, the program and/or data are stored in or on a non-transitory medium.

The flowchart and block diagrams illustrate architecture, functionality or an operation of possible implementations of systems, methods and computer program products according to various embodiments of the present disclosed subject matter. In this regard, each block in the flowchart or block diagrams may represent a module, segment, or portion of program code, which comprises one or more executable instructions for implementing the specified logical function (s). It should also be noted that, in some alternative implementations, illustrated operations may occur in a different order or as concurrent operations instead of sequential operations to achieve the same or equivalent effect.

The corresponding structures, materials, acts, and equivalents of all means or step plus function elements in the claims below are intended to include any structure, material, or act for performing the function in combination with other claimed elements as specifically claimed. As used herein, the singular forms "a", "an" and "the" are intended to include the plural forms as well, unless the context clearly indicates otherwise. It will be further understood that the terms "comprises" and/or "comprising" and/or "having" when used in this specification, specify the presence of stated features, integers, steps, operations, elements, and/or components, but do not preclude the presence or addition of one or more other features, integers, steps, operations, elements, components, and/or groups thereof.

The terminology used herein should not be understood as limiting, unless otherwise specified, and is for the purpose of describing particular embodiments only and is not intended to be limiting of the disclosed subject matter. While certain embodiments of the disclosed subject matter have been illustrated and described, it will be clear that the disclosure is not limited to the embodiments described herein. Numerous modifications, changes, variations, substitutions and equivalents are not precluded.

The invention claimed:

1. A computerized method for data conversion, comprising:
   receiving a data sequence at a proxy;
      receiving a dictionary having patterns respective to patterns in the data sequence at the proxy,
      wherein the data sequence and dictionary are received at the proxy in a converted form and then de-converted to obtain the original form of the data sequence and the dictionary;
      converting at the proxy the original form of the data sequence by substituting the patterns in the data sequence with at least one of (i) the patterns of the dictionary respective to the patterns in the data sequence, or (ii) references to the patterns if the dictionary respective to the patterns in the data sequence, or (iii) a combination thereof,
      transmitting the converted data sequence and dictionary from the proxy to a client over a network,
      wherein the proxy is a computerized apparatus configured to perform the method.

2. The method according to claim 1, wherein the data sequence is received in a converted form based on the dictionary.

3. The method according claim 1, wherein the data sequence is received in a converted form that comprises the dictionary, wherein said converting comprises generating a converted form of the original form of the data sequence using the dictionary, whereas the received converted form of the data sequence does not use the dictionary to form the converted form.

4. The method according to claim 1, wherein converting the data sequence comprises compressing the data sequence.

5. The method according to claim 1, wherein de-converting the converted form of the data sequence comprises decompressing the converted form of the data sequence.

6. The method according to claim 1, wherein converting the data sequence comprises encoding of the data sequence.

7. The method according to claim 1, wherein de-converting the converted form of the data sequence comprises decoding the converted form of the data sequence.

8. The method according to claim 3, wherein generating the converted form of the data sequence that is different from the received converted form of the data sequence comprises generating the converted form of the data sequence by an Accad process.

9. A computerized system for data conversion, comprising:
   a first computerized apparatus configured for generating a dictionary having patterns respective to patterns in a data sequence; and
   a second computerized apparatus configured to serve as a proxy for receiving from the first computerized apparatus,
   wherein the data sequence and dictionary are received at the proxy in a converted form and then de-converted to obtain the original form of the data sequence and the dictionary; and
   wherein the proxy is further configured for converting the original form of the data sequence by substituting the patterns in the data sequence with at least one of (i) the patterns of the dictionary respective to the patterns in the data sequence, or (ii) references to the patterns of the dictionary respective to the patterns in the data sequence, or (iii) a combination thereof; and
   to transmit the converted data sequence and dictionary from the proxy to a client over a network.

10. The system according to claim 9, wherein the first computerized apparatus is configured for providing the data sequence and the dictionary in a converted form to the second computerized apparatus,
   wherein the second computerized apparatus is configured for:
      converting the original form of the data sequence to generate a converted form of the data sequence using the dictionary, whereas the converted form of the data sequence provided by the first computerized apparatus does not use the dictionary to form the converted form.

11. The system according to claim 9, wherein converting the data sequence comprises compressing the data sequence.

12. The system according to claim 9, wherein de-converting the converted form of the data sequence comprises decompressing the converted form of the data sequence.

13. The system according to claim 9, wherein converting the data sequence comprises encoding of the data sequence.

14. The system according to claim 9, wherein de-converting the converted form of the data sequence comprises decoding the converted form of the data sequence.

15. The system according to claim 10, wherein the converted form of the data sequence that is different from the converted form of the data sequence provided by the first computerized apparatus is generated by an Accad process.

* * * * *